US010636712B2

United States Patent
Bae et al.

(10) Patent No.: US 10,636,712 B2
(45) Date of Patent: Apr. 28, 2020

(54) EPOXY RESIN COMPOSITION FOR SEALING SEMICONDUCTOR DEVICE, AND SEMICONDUCTOR DEVICE SEALED BY USING SAME

(71) Applicant: SAMSUNG SDI CO., LTD., Yongin-si, Gyeonggi-do (KR)

(72) Inventors: Kyoung Chul Bae, Uiwang-si (KR); Dong Hwan Lee, Uiwang-si (KR)

(73) Assignee: Samsung SDI Co., Ltd., Yongin-Si, Gyeonggi-do (KR)

( * ) Notice: Subject to any disclaimer, the term of this patent is extended or adjusted under 35 U.S.C. 154(b) by 0 days.

(21) Appl. No.: 15/554,304

(22) PCT Filed: Jul. 16, 2015

(86) PCT No.: PCT/KR2015/007392
§ 371 (c)(1),
(2) Date: Aug. 29, 2017

(87) PCT Pub. No.: WO2016/175385
PCT Pub. Date: Nov. 3, 2016

(65) Prior Publication Data
US 2018/0053703 A1     Feb. 22, 2018

(30) Foreign Application Priority Data

Apr. 29, 2015   (KR) .................. 10-2015-0060933

(51) Int. Cl.
| | | |
|---|---|---|
| *H01L 23/29* | (2006.01) | |
| *C08K 3/22* | (2006.01) | |
| *C08K 3/34* | (2006.01) | |
| *C09D 163/00* | (2006.01) | |
| *C08K 3/36* | (2006.01) | |
| *C08G 59/62* | (2006.01) | |
| *C08G 59/68* | (2006.01) | |

(52) U.S. Cl.
CPC .............. *H01L 23/295* (2013.01); *C08K 3/22* (2013.01); *C08K 3/34* (2013.01); *C08K 3/36* (2013.01); *C09D 163/00* (2013.01); *C08G 59/621* (2013.01); *C08G 59/686* (2013.01); *C08K 2003/2227* (2013.01); *C08K 2201/001* (2013.01); *C08K 2201/003* (2013.01); *C08K 2201/006* (2013.01); *C08K 2201/011* (2013.01); *H01L 23/293* (2013.01)

(58) Field of Classification Search
CPC .................................................. H01L 23/295
See application file for complete search history.

(56) References Cited

U.S. PATENT DOCUMENTS

| | | | |
|---|---|---|---|
| 2004/0152803 A1* | 8/2004 | Ahsan ................. | C08G 59/621 523/400 |
| 2006/0084727 A1 | 4/2006 | Yan et al. | |
| 2012/0177974 A1* | 7/2012 | Nakajima ............. | H01M 2/166 429/144 |
| 2013/0096245 A1* | 4/2013 | Nair ...................... | B82Y 30/00 524/444 |

FOREIGN PATENT DOCUMENTS

| | | |
|---|---|---|
| CN | 103649218 A | 3/2014 |
| CN | 103694636 A | 4/2014 |
| CN | 104031353 A | 9/2014 |
| CN | 104119704 A | 10/2014 |
| CN | 104231993 A | 12/2014 |
| EP | 1067163 A1 | 1/2001 |
| KR | 2003-0057088 A | 7/2003 |
| KR | 10-0637611 B1 | 10/2006 |
| KR | 10-2007-0069714 A | 7/2007 |
| KR | 10-2014-0133178 A | 11/2014 |

OTHER PUBLICATIONS

Mingxian Liu, et. al., Properties of halloysite nanotube-epoxy resin hybrids and the interfacial reactions in the systems, Nanotechnology, 2007. 10. 10., vol. 18, No. 45.
Korean Office Action dated Jul. 26, 2017 in the corresponding Korean Patent Application No. 10-2015-0060933.
Taiwanese Office Action dated Sep. 30, 2017 in the corresponding Taiwanese Patent Application No. 104133782.
The Chemistry of Clay Minerals, 1973, p. 104-108.
Thermal Conductive Polymer Materials, National Defense Industry Press, 2014, p. 322.
Liu, et al., Properties of halloysite nanotube-epoxy resin hybrids and the interfacial reactions in the systems, Mingxian Liu et al., Nanotechnology, vol. 18, p. 455703.
Chinese Office Action dated Jun. 12, 2018 in the corresponding Chinese Patent Application No. 201580076601.3.
Liu, M. et al., "Properties of halloysite nanotube-epoxy resin hybrids and the interfacial reactions in the systems", Nanotechnology, 18 (2007), pp. 1-9.
Rawtani, D. et al.,"Multifarious Applications of Halloysite Nanotubes: A Review", Advanced Study Center Co. Ltd., 30, 2012, 282-295.
Marini, J. et al., "Halloysite Nanotubes as Reinforcing Fillers in Polymeric Nanocomposites", Society of Plastics Engineers, 2013.

\* cited by examiner

*Primary Examiner* — Megan McCulley
(74) *Attorney, Agent, or Firm* — Lee IP Law, PC

(57) ABSTRACT

An epoxy resin composition for sealing a semiconductor device, of the present invention, contains an inorganic filler, and the inorganic filler contains a nanomaterial containing silicon (Si) and aluminium (Al).

9 Claims, No Drawings

EPOXY RESIN COMPOSITION FOR SEALING SEMICONDUCTOR DEVICE, AND SEMICONDUCTOR DEVICE SEALED BY USING SAME

TECHNICAL FIELD

The present invention relates to an epoxy resin composition for encapsulating a semiconductor device, and a semiconductor device encapsulated using the same.

BACKGROUND ART

In order to protect semiconductor devices from an external environment such as moisture, mechanical shock, and the like, encapsulation of the semiconductor devices using an epoxy resin composition has been commercially conducted. Recently, with general use of thin, small scale portable digital devices, integration density of semiconductor devices has been increasingly improved, enabling high-density stacking of semiconductor ships. In a resin-encapsulated semiconductor apparatus in which such high-density stacked semiconductor devices are encapsulated in a compact and thin package, package malfunction and cracking can frequently occur due to heat generated during operation. To solve this problem, use of a heat sink has been proposed by Korean Patent Publication No. 2007-0069714. However, this technique can be applied only to some packages and has a problem of deterioration in productivity and high cost due to additional processes.

In addition, as a semiconductor package becomes light, thin and miniaturized, the semiconductor package suffers from warpage due to a difference in coefficient of thermal expansion between semiconductor chips, a lead frame and an epoxy resin composition for encapsulation, constituting the package.

Therefore, there is a need for an epoxy resin composition for encapsulating a semiconductor device which exhibits excellent heat dissipation and flexural properties.

DISCLOSURE

Technical Problem

It is one object of the present invention to provide an epoxy resin composition for encapsulating a semiconductor device which exhibits excellent heat dissipation and flexural strength and is highly resistant to thermal shock, and a semiconductor device encapsulated using the same.

It is another object of the present invention to provide an epoxy resin composition for encapsulating a semiconductor device which exhibits excellent thermal conductivity without suffering deterioration in flowability, coefficient of thermal expansion, flexural modulus, and moisture absorption rate.

The above and other objects can be achieved according to the present invention described below.

Technical Solution

One aspect of the present invention relates to an epoxy resin composition for encapsulating a semiconductor device.

In one embodiment, the epoxy resin composition for encapsulating a semiconductor device includes an epoxy resin, a curing agent, and inorganic fillers, wherein the inorganic fillers include nanomaterials containing silicon (Si) and aluminum (Al).

The nanomaterials may have an average particle diameter of 10 nm to 500 nm.

The nanomaterials may include at least one of nanowires, nanorods, nanotubes, and nanoribbons.

In the nanomaterials, a mole ratio of silicon (Si) to aluminum (Al) may range from 0.1:1 to 5:1.

The nanomaterials may be represented by Formula 8:

$$Al_2O_3 \cdot (SiO_2)_x \cdot y(H_2O)$$ [Formula 8]

(where x ranges from 0.5 to 5, and y ranges from 1 to 10).

The nanomaterials may have a thermal conductivity of 5 W/mK to 30 W/mK.

The nanomaterials may have a specific surface area of 5 $m^2/g$ to 100 $m^2/g$.

The nanomaterials may have a pH of 7 to 9.

The nanomaterials may be formed of silica ($SiO_2$) and alumina ($Al_2O_3$).

In the nanomaterials, mole ratio of silica ($SiO_2$) to alumina ($Al_2O_3$) may range from 0.5:1 to 5:1.

In another embodiment, the nanomaterials may have a structure wherein one or more silica ($SiO_2$) layers and one or more alumina ($Al_2O_3$) layers are stacked one above another.

The nanomaterials may include nanotubes having an inner diameter of 1 nm to 300 nm, an outer diameter of 20 nm to 310 nm, and a length of 0.1 μm to 20 μm.

The nanomaterials may be present in an amount of 0.01 wt % to 40 wt % in the composition in terms of solid content.

The inorganic fillers may include at least one of alumina having an average particle diameter of greater than or equal to 0.1 μm and less than or equal to 4 μm; alumina having an average particle diameter of greater than 4 μm and less than or equal to 10 μm; and alumina having an average particle diameter of greater than 10 μm and less than or equal to 30 μm.

In another embodiment, the epoxy resin composition may further include at least one of a curing accelerator, a coupling agent and a colorant.

The epoxy resin composition may have a thermal conductivity of 3 W/mK to 10 W/mK, as measured on a thermal conductivity specimen (ASTM D5470) at 25° C., the specimen being prepared by injection molding of the epoxy resin composition under conditions of a mold temperature of 175° C., an injection load of 9 MPa, and a curing time of 120 seconds using a transfer molding machine.

Another aspect of the present invention relates to a semiconductor device.

In one embodiment, the semiconductor device may be encapsulated using any one of the epoxy resin compositions for encapsulating a semiconductor device, as set forth above.

Advantageous Effects

The present invention provides an epoxy resin composition for encapsulating a semiconductor device which exhibits excellent heat dissipation and flexural strength, is highly resistant to thermal shock, and exhibits excellent thermal conductivity without suffering deterioration in flowability, coefficient of thermal expansion, flexural modulus, and moisture absorption rate, and a semiconductor device encapsulated using the same.

BEST MODE

As used herein, the term "nanomaterials" refers to materials having a nanoscale average particle diameter.

As used herein, the term "average particle diameter" refers to a particle diameter of the nanomaterials which is measured in an aqueous or organic solvent using a Zetasizer Nano ZS (Malvern Instruments UK) and expressed by a Z-average value.

As used herein, the terms "inner diameter" and "outer diameter" refer to inner diameter and outer diameter of nanotubes, respectively.

An epoxy resin composition for encapsulating a semiconductor device according to the present invention includes an epoxy resin, a curing agent, and inorganic fillers, wherein the inorganic fillers include nanomaterials containing silicon (Si) and aluminum (Al).

Epoxy Resin

In the present invention, the epoxy resin is not particularly limited so long as the epoxy resin is commonly used for encapsulating semiconductor devices. Specifically, the epoxy resin may be an epoxy compound having two or more epoxy groups. Examples of such an epoxy resin may include epoxy resins obtained by epoxidation of a condensate of a phenol or an alkyl phenol and a hydroxybenzaldehyde, phenol novolac type epoxy resins, cresol novolac type epoxy resins, polyfunctional epoxy resins, naphthol novolac type epoxy resins, novolac type epoxy resins of bisphenol A/bisphenol F/bisphenol AD, glycidyl ethers of bisphenol A/bisphenol F/bisphenol AD, bishydroxybiphenyl epoxy resins, dicyclopentadiene epoxy resins, and the like.

For example, the epoxy resin may include at least one of a polyfunctional epoxy resin, a phenol aralkyl type epoxy resin, and a biphenyl type epoxy resin. The polyfunctional epoxy resin may be a polyfunctional epoxy resin represented by Formula 1, the phenol aralkyl type epoxy resin may be a phenol aralkyl type epoxy resin having a novolac structure containing a biphenyl derivative represented by Formula 2, and the biphenyl type epoxy resin may be a biphenyl type epoxy resin represented by Formula 3.

[Formula 1]

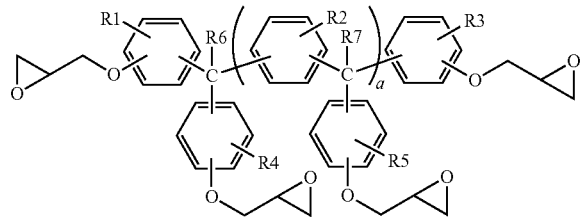

(where R1, R2, R3, R4 and R5 are each independently a hydrogen atom or a $C_1$ to $C_6$ alkyl group, R6 and R7 are each independently a hydrogen atom, a methyl group, or an ethyl group, and a is an integer from 0 to 6).

Specifically, R1, R2, R3, R4 and R5 may be each independently hydrogen, a methyl group, an ethyl group, a propyl group, an isopropyl group, an n-butyl group, an isobutyl group, a tert-butyl group, a pentyl group, or a hexyl group, and R6 and R7 may be hydrogen, without being limited thereto.

Specifically, the polyfunctional epoxy resin may be a triphenol alkane type epoxy resin such as a triphenol methane type epoxy resin, a triphenol propane type epoxy resin, and the like.

[Formula 2]

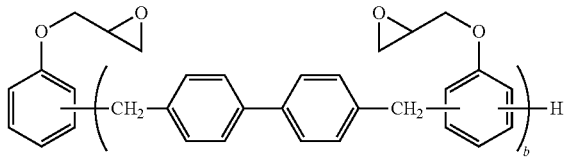

(where b ranges from 1 to 7 on average)

[Formula 3]

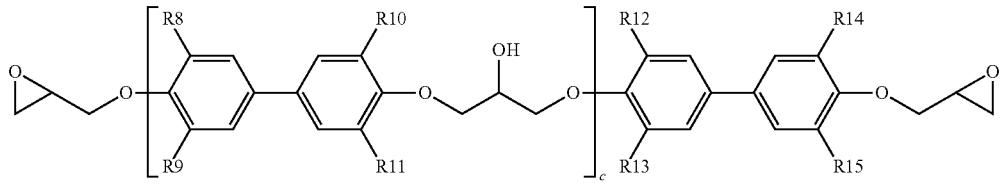

(where R8, R9, R10, R11, R12, R13, R14 and R15 are each independently a $C_1$ to $C_4$ alkyl group, and c ranges from 0 to 7 on average).

Advantageously, the polyfunctional epoxy resin represented by Formula 1 can reduce package deformation and has excellent properties in terms of fast curability, latency, and preservability while exhibiting excellent strength after curing and adhesion.

Advantageously, the phenol aralkyl type epoxy resin represented by Formula 2 has a biphenyl structure with a phenol backbone and thus exhibits excellent moisture absorption, toughness, oxidation resistance, and crack resistance. In addition, the phenol aralkyl type epoxy resin has low crosslinking density and thus forms a carbon layer (char) when burned at high temperature, thereby securing a certain degree of flame retardancy. The biphenyl type epoxy resin represented by Formula 3 can advantageously enhance fluidity and reliability of the resin composition.

These epoxy resins may be used alone or in combination thereof. In addition, the epoxy resin may be used in the form of adducts, such as a melt master batch, obtained by pre-reaction of the aforementioned epoxy resins with other components such as a curing agent, a curing accelerator, a release agent, a coupling agent, and a stress relief agent. Further, to improve moisture resistance reliability, the epoxy resin is desirably an epoxy resin containing a low amount of chlorine ions, sodium ions, and other ionic impurities.

In some embodiments, the epoxy resin may include the phenol aralkyl type epoxy resin represented by Formula 2 and the biphenyl type epoxy resin represented by Formula 3 in a weight ratio of about 0.2:1 to about 5:1, specifically about 0.4:1 to about 3:1, more specifically about 0.5:1 to about 2:1. When the mixing ratio of the phenol aralkyl type epoxy resin to the biphenyl type epoxy resin satisfies the above range, the epoxy resin composition can exhibit excellent properties in terms of moisture absorption, oxidation resistance, and balance between crack resistance and fluidity.

The epoxy resin may be present in an amount of about 0.1 wt % to about 15 wt %, specifically about 0.1 wt % to about 10 wt %, more specifically about 0.1 wt % to about 5 wt % in the epoxy resin composition for encapsulating a semiconductor device. When the amount of the epoxy resin satisfies the above range, the epoxy resin composition can exhibit further enhanced adhesion and strength.

Curing Agent

The curing agent may include any typical curing agents for encapsulating a semiconductor device and is preferably a curing agent containing at least two reactive groups.

Examples of the curing agent may include phenol aralkyl type phenol resins, phenol novolac type phenol resins, xylok type phenol resins, cresol novolac type phenol resins, naphthol type phenol resins, terpene type phenol resins, polyfunctional phenol resins, dicyclopentadiene phenol resins, novolac type phenol resins synthesized from bisphenol A and resol, multivalent phenol compounds including tris(hydroxyphenyl)methane and dihydroxybiphenyl, acid anhydrides including maleic anhydride and phthalic anhydride, and aromatic amines such as metaphenylene diamine, diamino diphenyl methane, and diamino diphenylsulfone, without being limited thereto.

For example, the curing agent may include at least one of a phenol novolac type phenol resin, a xylok type phenol resin, a phenol aralkyl type phenol resin, and a polyfunctional phenol resin. The phenol novolac type phenol resin may be, for example, a phenol novolac type phenol resin represented by Formula 4, and the phenol aralkyl type phenol resin may be, for example, a phenol aralkyl type phenol resin of a novolac structure containing a biphenyl derivative in a molecule as represented by Formula 5. In addition, the xylok type phenol resin may be, for example, a xylok type phenol resin represented by Formula 6, and the polyfunctional phenol resin may be, for example, a polyfunctional phenol resin containing a repeat unit represented by Formula 7.

[Formula 4]

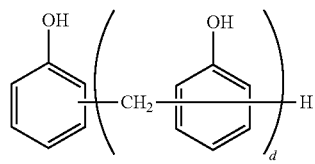

(where d ranges from 1 to 7).

[Formula 5]

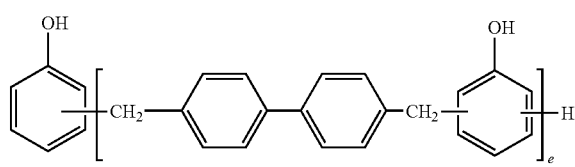

(where e ranges from 1 to 7 on average).

[Formula 6]

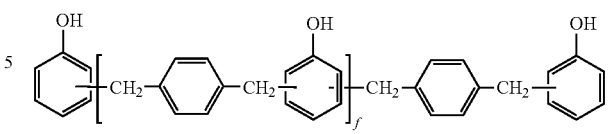

(where f ranges from 0 to 7 on average).

[Formula 7]

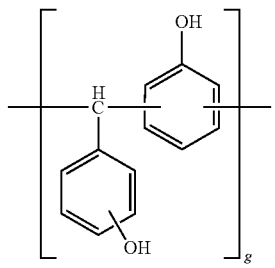

(where g ranges from 1 to 7 on average).

The phenol novolac type phenol resin represented by Formula 4 has crosslink points spaced at short intervals and thus exhibits high crosslinking density upon reaction with the epoxy resin. As a result, a cured product thereof can exhibit increased glass transition temperature and thus reduced coefficient of linear expansion, thereby suppressing warpage of a semiconductor device package. The phenol aralkyl type phenol resin represented by Formula 5 reacts with the epoxy resin to form a carbon layer (char) blocking heat and oxygen in a surrounding environment, thereby providing flame retardancy. The xylok type phenol resin represented by Formula 6 can advantageously enhance flowability and reliability of the resin composition. The polyfunctional phenol resin containing a repeat unit represented by Formula 7 can advantageously enhance flexural properties at high temperature of the epoxy resin composition.

These curing agents may be used alone or in combination thereof. In addition, the curing agent may be used in the form of adducts, such as a melt master batch, obtained by pre-reacting the above curing agents with other components such as the epoxy resin, a curing accelerator, a release agent, a coupling agent, and a stress relief agent.

The curing agent may be present in an amount of 0.1 wt % to 13 wt %, preferably 0.1 wt % to 10 wt %, more preferably 0.1 wt % to 8 wt % in the epoxy resin composition for encapsulating a semiconductor device. Within this range, the epoxy resin composition can exhibit excellent degree of curing and strength after curing.

The mixing ratio of the epoxy resin to the curing agent may be adjusted according to mechanical properties and moisture resistance reliability required for a semiconductor package. For example, the chemical equivalent ratio of the epoxy resin to the curing agent may range from about 0.95 to about 3, specifically from about 1 to about 2, more specifically from 1 to about 1.75. When the mixing ratio of the epoxy resin to the curing agent satisfies the above range, the epoxy resin composition can exhibit excellent strength after curing.

Inorganic Fillers

The inorganic fillers may include nanomaterials containing silicon (Si) and aluminum (Al).

The nanomaterials containing silicon (Si) and aluminum (Al) are included in the inorganic fillers to maximize heat dissipation. To enhance heat dissipation properties of the epoxy resin composition, increase in the content of alumina, which has high thermal conductivity, has been proposed. However, this can deteriorate flowability of the epoxy resin composition, thereby causing failure, such as warpage of a gold wire. When the epoxy resin composition includes the nanomaterials containing silicon and alumina, the epoxy resin can exhibit excellent heat dissipation properties without suffering deterioration in flowability.

The nanomaterials containing silicon (Si) and aluminum (Al) may have an average particle diameter of about 10 nm to about 500 nm, specifically about 20 nm to about 450 nm, more specifically about 20 nm to about 400 nm. When the average particle diameter of the nanomaterials satisfies the above range, the epoxy resin composition can exhibit further enhanced heat dissipation and flexural strength.

In the nanomaterials containing silicon (Si) and aluminum (Al), the mole ratio of silicon (Si) to aluminum (Al) may range from about 0.1:1 to about 5:1, specifically from about 0.2:1 to about 3:1, more specifically from about 0.25:1 to about 2:1, even more specifically from about 0.4:1 to about 1.5:1. When the mole ratio of silicon to aluminum satisfies the above range, the epoxy resin composition can advantageously exhibit further increased thermal conductivity.

For example, the nanomaterials containing silicon (Si) and aluminum (Al) may be represented by Formula 8:

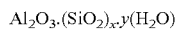

$$Al_2O_3 \cdot (SiO_2)_x \cdot y(H_2O)$$ [Formula 8]

(where x ranges from 0.5 to 5, and y ranges from 1 to 10). Specifically, x may range from 1 to 3, more specifically 1.5 to 2.5. In addition, y may range from 1 to 5, specifically from 1 to 4. Within this range, the epoxy resin composition can advantageously exhibit increased thermal conductivity.

The nanomaterials may be formed of silica ($SiO_2$) and alumina ($Al_2O_3$) and have a layered structure. For example, the nanomaterials may have a structure wherein one or more silica ($SiO_2$) layers and one or more alumina ($Al_2O_3$) layers are stacked one above another. Here, in the nanomaterials, the mole ratio of silica ($SiO_2$) to alumina ($Al_2O_3$) may range from about 0.5:1 to 5:1, specifically from about 1:1 to 3:1, more specifically from about 1.5:1 to 2.5:1. Within this range, the epoxy resin composition can advantageously exhibit increased thermal conductivity.

The nanomaterials containing silicon (Si) and aluminum (Al) may have a thermal conductivity of about 5 W/mK to about 30 W/mK, specifically about 10 W/mK to about 25 W/mK, more specifically about 10 W/mK to about 20 W/mK. When the thermal conductivity of the nanomaterials satisfies the above range, the nanomaterials can advantageously enhance heat dissipation properties of the epoxy resin composition while preventing deterioration in flowability of the composition.

The nanomaterials containing silicon (Si) and aluminum (Al) may have a specific surface area of about 5 $m^2$/g to about 100 $m^2$/g, specifically about 10 $m^2$/g to about 80 $m^2$/g, more specifically about 20 $m^2$/g to about 50 $m^2$/g. When the specific surface area of the nanomaterials satisfies the above range, the nanomaterials can provide further enhanced heat dissipation.

The nanomaterials containing silicon (Si) and aluminum (Al) may have a pH of 7 to 9, specifically 7 to 8.5. Within this range, the epoxy resin composition can be prevented from oxidation of aluminum (Al) and silicon (Si). Here, pH was measured after a process wherein 2 g of the nanomaterials containing silicon (Si) and aluminum (Al) was placed into a container, and then the container was filled with 100 g of ultra-pure water, followed by boiling at 100° C. for 24 hours.

The nanomaterials containing silicon (Si) and aluminum (Al) may be prepared in the form of nanowires, nanorods, nanotubes, nanoribbons, or a combination thereof. The nanowires may have a length of about 50 μm to about 250 μm, specifically about 70 μm to about 100 μm. The nanorods may have a particle diameter of about 20 nm to about 200 nm, specifically about 40 nm to about 100 nm, a length of about 50 nm to about 1,500 nm, specifically about 70 nm to about 1,000 nm. The nanoribbons may have an average particle diameter of about 10 nm to 500 nm, specifically about 20 nm to about 450 nm, more specifically about 20 nm to about 400 nm. When the size of the nanomaterials satisfies the above range, the nanomaterials can advantageously enhance heat dissipation properties of the epoxy resin composition while improving flexural strength of the composition.

Specifically, the nanomaterials may be nanotubes. The nanotubes may have an inner diameter of about 1 nm to about 300 nm, specifically about 5 nm to about 250 nm, an outer diameter of about 20 nm to about 310 nm, specifically about 20 nm to about 150 nm, and a length of about 0.1 μm to about 20 μm, specifically about 0.1 μm to about 10 μm, more specifically about 0.1 μm to about 5 μm. In this case, the epoxy resin composition can provide further enhanced heat dissipation by virtue of large surface area of the nanomaterials.

The nanomaterials may be present in an amount of about 0.01 wt % to about 45 wt %, specifically about 0.01 wt % to about 40 wt %, more specifically about 0.01 wt % to about 30 wt % based on the total weight of the inorganic fillers. In addition, the nanomaterials may be present, in terms of solid content, in an amount of about 0.01 wt % to about 40 wt %, specifically about 0.01 wt % to about 30 wt %, more specifically about 0.01 wt % to about 25 wt % in the epoxy resin composition. When the content of the nanomaterials satisfies the above range, the epoxy resin composition can exhibit further enhanced mechanical properties such as heat dissipation, flexural strength, and the like, as well as flowability.

The inorganic fillers may include second inorganic materials together with the nanomaterials. The second inorganic materials are different from the nanomaterials and may be any typical inorganic fillers. Examples of the second inorganic materials may include alumina, fused silica, nanomaterials containing silicon (Si) and aluminum (Al), crystalline silica, aluminum nitride, boron nitride, ferrite, nickel-zinc ferrite, manganese-zinc ferrite, calcium carbonate, magnesium carbonate, magnesia, clay, talc, calcium silicate, titanium oxide, antimony oxide, and glass fiber. For example, the second inorganic materials may include at least one of alumina nitride having an average particle diameter of from 0.1 μm to 100 μm, boron nitride having an average diameter of from 0.1 μm to 100 μm, silica having an average particle diameter of from 0.1 μm to 100 μm, and ferrite having an average particle diameter of from 0.1 μm to 100 μm, specifically nickel-zinc ferrite having an average particle diameter of from 0.1 μm to 100 μm and manganese-zinc ferrite having an average particle diameter of from 0.1 μm to 100 μm. These may be used alone or as a mixture thereof.

The boron nitride has excellent thermal conductivity and is thus effective in enhancing reliability of a power module package, such as TO-3PF and TO-220F, requiring good heat dissipation, as well as in resin encapsulation of the package. It is desirable in terms of fluidity, moldability, heat dissipation properties, mechanical strength, and reliability of the resin composition that the boron nitride be present in an amount of about 0.5 wt % to about 10 wt %, specifically about 1 wt % to 7 wt %, more specifically about 2 wt % to about 5 wt % based on the total weight of the epoxy resin composition. The boron nitride may be separately added in preparation of the epoxy resin composition, or may be added to the composition after being previously dissolved and dispersed in a melt of the epoxy resin or a curing agent for uniform dispersion thereof, for example, in the form of a melt master batch (MMB).

In some embodiments, the inorganic fillers may further include alumina. Here, the alumina may have a thermal conductivity of about 15 W/mK to about 40 W/mK, specifically about 20 W/mK to about 30 W/mK, more specifically about 25 W/mK to about 30 W/mK. When alumina having a thermal conductivity satisfying the above range is used, it is possible to further enhance heat dissipation of the epoxy resin composition.

Although the shape and particle diameter of the alumina are not particularly limited, the alumina may be spherical alumina having an average particle diameter of about 0.1 μm to about 50 μm, specifically about 0.5 μm to about 30 μm. When alumina having an average particle diameter satisfying the above range is used, the epoxy resin composition can exhibit excellent flowability in encapsulation molding of a semiconductor device.

In addition, the alumina may be a mixture of alumina particles having different average particle diameters. For example, the alumina may be prepared by mixing 40 wt % to 93 wt % of alumina having an average particle diameter of greater than 10 μm and less than or equal to 30 μm, 5 wt % to 50 wt % of alumina having an average particle diameter of greater than 4 μm and less than or equal to 10 μm, and 1 wt % to 30 wt % of alumina having an average particle diameter of greater than or equal to 0.1 μm and less than or equal to 4 μm based on the total weight of the alumina mixture. With such an alumina mixture, the epoxy resin composition can exhibit further enhanced heat dissipation, flexural strength, and thermal shock resistance.

The alumina mixture may be present in an amount of 40 wt % to 99.99 wt % based on the total weight of the inorganic fillers. When the content of the alumina mixture satisfies the above range, the epoxy resin composition can exhibit further enhanced mechanical properties such as heat dissipation, flexural strength, and the like as well as moldability. In another embodiment, the inorganic fillers may further include fused silica having a low coefficient of linear expansion to reduce stress of the epoxy resin composition. The fused silica refers to amorphous silica having a true specific gravity of 2.3 or less. The fused silica may include amorphous silica which is produced by melting crystalline silica or synthesized from various materials. Although the shape and particle diameter of the fused silica are not particularly limited, the inorganic fillers may be a fused silica mixture including 50 wt % to 99 wt % of spherical fused silica having an average particle diameter of about 5 μm to about 30 μm and 1 wt % to 50 wt % of spherical fused silica having an average particle diameter of 0.001 μm to 1 μm. With such a fused silica mixture, the resin composition can advantageously exhibit excellent flowability. Preferably, the fused silica mixture is present in an amount of 40 wt % to 100 wt % based on the total weight of the inorganic fillers. Within this range, a cured product of the resin composition can exhibit excellent moldability, low stress properties, and mechanical properties. In addition, the maximum particle diameter of the fused silica may be adjusted to any one of 45 μm, 55 μm, and 75 μm depending upon desired use of the resin composition. The spherical fused silica may include conductive carbon as foreign substances on a surface thereof. In this case, it is desirable to select a material having fewer polar foreign substances therein.

The weight ratio of the nanomaterials to the second inorganic materials may range from about 1:10,000 to 2:1, specifically about 1:1,000 to 1:1. Within this range, the epoxy resin composition can exhibit further enhanced heat dissipation properties, mechanical properties such as flexural strength, and flowability.

The epoxy resin composition for encapsulating a semiconductor device may further include at least one of a curing accelerator, a coupling agent, and a colorant.

Curing Accelerator

The curing accelerator serves to promote reaction between the epoxy resin and the curing agent. Examples of the curing accelerator may include tertiary amines, organometallic compounds, organophosphorus compounds, imidazole compounds, boron compounds, and the like. Examples of the tertiary amines include benzyldimethylamine, triethanolamine, triethylenediamine, dimethylaminoethanol, tri(dimethylaminomethyl)phenol, 2-2-(dimethylaminomethyl) phenol, 2,4,6-tris(diaminomethyl)phenol, and salts of tri-2-ethylhexanoic acid.

Examples of the organometallic compounds include chromium acetylacetonate, zinc acetylacetonate, and nickel acetylacetonate. Examples of the organophosphorus compounds include tris(4-methoxy)phosphine, tetrabutylphosphonium bromide, tetraphenylphosphonium bromide, phenylphosphine, diphenylphosphine, triphenylphosphine, triphenylphosphine triphenylborane, and triphenylphosphine-1,4-benzoquinone adducts. Examples of the imidazole compounds include 2-phenyl-4-imidazole, 2-methylimidazole, 2-phenylimidazole, 2-aminoimidazole, 2-methyl-1-vinylimidazole, 2-ethyl-4-methylimidazole, and 2-heptadecylimidazole. Examples of the boron compounds include tetraphenylphosphonium-tetraphenylborate, triphenylphosphine tetraphenylborate, tetraphenylboron salts, trifluoroborane-n-hexylamine, trifluoroborane monoethylamine, tetrafluoroborane triethylamine, and tetrafluoroborane amine. In addition, 1,5-diazabicyclo[4.3.0]non-5-ene (DBN), 1,8-diazabicyclo[5.4.0]undec-7-ene (DBU), and phenol novolac resin salts may be used.

Specifically, as the curing accelerator, organophosphorus compounds, boron compounds, and amine or imidazole curing accelerators may be used alone or in combination thereof. Further, the curing accelerator may be used in the form of adducts obtained by pre-reacting these compounds with the epoxy resin or the curing agent.

The curing accelerator may be present in an amount of about 0.01 wt % to about 2 wt %, specifically about 0.02 wt % to about 1.5 wt %, more specifically about 0.05 wt % to about 1 wt % based on the total weight of the epoxy resin composition. Within this range, the curing accelerator can promote curing of the epoxy resin composition while securing good degree of curing.

Coupling Agent

The epoxy resin composition for encapsulating a semiconductor device may further include a coupling agent. The coupling agent may be a silane coupling agent. The silane coupling agent is not particularly limited so long as the silane coupling agent reacts with the epoxy resin and the inorganic fillers to enhance strength of an interface between the epoxy resin and the inorganic fillers. For example, the coupling agent may be epoxysilane, aminosilane, ureidosilane, mercaptosilane, or the like. These coupling agents may be used alone or in combination thereof.

The coupling agent may be present in an amount of about 0.01 wt % to about 5 wt %, preferably about 0.05 wt % to about 3 wt %, more preferably about 0.1 wt % to about 2 wt % based on the total weight of the epoxy resin composition. Within this range, the epoxy resin composition can exhibit enhanced strength after curing.

Colorant

The colorant may be used for laser marking of an encapsulation material for a semiconductor device.

The colorant may include a mixture of titanium nitride and titanium black. In the mixture, titanium nitride may be present in an amount of 40 wt % to 80 wt %, and titanium black may be present in an amount of 20 wt % to 60 wt %. Within this range, the epoxy resin composition can prevent marking failure, soot formation, and the like, during laser marking.

The mixture of titanium nitride and titanium black may be present in an amount of 40 wt % to 100 wt % in the colorant. Within this range, the epoxy resin composition can prevent marking failure, soot formation, and the like, during laser marking.

The titanium nitride may have an average particle diameter of about 50 nm to 150 nm, and the titanium black may have an average particle diameter of about 50 nm to about 150 nm. Within this range, the colorant exhibits high dispersibility, thereby avoiding agglomeration.

The mixture of titanium nitride and titanium black may be present in an amount of greater than 0 wt % and less than or equal to 6 wt %, for example, 0.5 wt % to 5.0 wt %. Within this range, the epoxy resin composition can be successfully laser marked, exhibit excellent markability even using a low output laser, and prevent soot formation during laser marking.

The colorant may further include, in addition to the mixture of titanium nitride and titanium black, at least one of dicopper hydroxide phosphate, iron oxide, mica, and carbon black.

The dicopper hydroxide phosphate can enhance laser markability, reduce soot formation due to use of carbon black, and improve reliability and moldability of the resin composition.

The dicopper hydroxide phosphate may have a weight average molecular weight of about 100 g/mol to about 500 g/mol. When the weight average molecular weight of the dicopper hydroxide phosphate satisfies the above range, it is possible to enhance laser markability of the epoxy resin composition and to improve reliability and moldability of the composition.

In addition, the dicopper hydroxide phosphate may have a bulk density of about 500 g/l to about 700 g/l. When the bulk density of the dicopper hydroxide phosphate satisfies the above range, it is possible to enhance laser markability of the epoxy resin composition and to improve reliability and moldability of the composition.

The dicopper hydroxide phosphate may have an average particle diameter (d50) of about 1 μm to 5 μm. Within this range, the dicopper hydroxide phosphate can be used in the epoxy resin composition.

The dicopper hydroxide phosphate may be represented by $Cu_3(PO_4)_2 \cdot Cu(OH)_2$. As the dicopper hydroxide phosphate, a commercially available product, such as Fabulase 322, may be used.

The dicopper hydroxide phosphate may be present in an amount of about 0 wt % to 0.25 wt %, for example, greater than 0 wt % and less than or equal to 0.25 wt %, for example, about 0.05 wt % to 0.25 wt %, in the epoxy resin composition. Within this range, the dicopper hydroxide phosphate can enhance laser markability of the epoxy resin composition and achieve marking properties comparable to typical carbon black.

The iron oxide is obtained by oxidation of iron and is not limited in terms of the oxidation number of iron. For example, the iron oxide may be $FeO_3$, $Fe_2O_3$, and the like.

The iron oxide may be present in an amount of about 0 wt % to 1.5 wt %, for example, greater than 0 wt % and less than or equal to 1.5 wt %, for example, about 0.1 wt % to 2 wt %, in the epoxy resin composition. Within this range, the iron oxide can enhance laser markability of the epoxy resin composition and achieve marking properties comparable to typical carbon black.

The mica may be present in an amount of about 0 wt % to 1.5 wt %, for example, greater than 0 wt % and less than or equal to 1.5 wt %, for example, about 0.1 wt % to 2 wt %, in the epoxy resin composition. Within this range, the mica can enhance laser markability of the epoxy resin composition and achieve marking properties comparable to typical carbon black.

A mixture of the iron oxide and the mica may be present in an amount of about 0 wt % to 1.5 wt %, for example, greater than 0 wt % and less than or equal to 1.5 wt %, for example, about 0.3 wt % to 1.5 wt %, in the epoxy resin composition. Within this range, the mixture can enhance laser markability of the epoxy resin composition and achieve marking properties comparable to typical carbon black.

The carbon black may be present in an amount of about 0 wt % to 1.5 wt %, for example, greater than 0 wt % and less than or equal to 1.5 wt %, for example, about 0.1 wt % to 1.5 wt %, in the epoxy resin composition. Within this range, the carbon black does not affect laser marking properties of other colorants while not causing soot formation during laser marking.

A mixture of the iron oxide, the mica, and the carbon black may be present in an amount of about 0 wt % to 1.6 wt %, for example, greater than 0 wt % and less than or equal to 1.6 wt %, for example, about 0.1 wt % to 1.6 wt %, in the epoxy resin composition. Within this range, the mixture does not affect laser marking properties of other colorants while not causing soot formation during laser marking.

The colorant may be present in an amount of about 0.05 wt % to about 4.0 wt % in the epoxy resin composition. Within this range, it is possible to avoid insufficient marking of the epoxy resin composition, prevent deterioration in markability due to soot formation during laser marking, and prevent deterioration in electrical conductivity of the resin composition.

In addition, as needed, the epoxy resin composition according to the present invention may further include a release agent such as higher fatty acids, higher fatty acid metal salts, and ester wax; a stress relief agent such as modified silicone oil, silicone powder, and silicone resins; and antioxidants such as tetrakis[methylene-3-(3,5-di-tert-butyl-4-hydroxyphenyl)propionate]methane without affecting the objects of the present invention.

As a general method for preparing an epoxy resin composition using the aforementioned components, there has been used a method wherein predetermined amounts of the components are mixed uniformly and sufficiently using a Henschel mixer or a Lödige mixer, followed by melt kneading using a roll mill or a kneader, and then cooling and pulverizing, thereby obtaining a final powder product.

As a method for encapsulating a semiconductor device using the epoxy resin composition obtained according to the present invention, low-pressure transfer molding may be generally used. However, it should be understood that injection molding or casting may also be employed for molding of the epoxy resin composition. By the aforementioned methods, the epoxy resin composition may be applied to a copper lead frame (for example, a silver plated copper lead frame), a nickel alloy lead frame, a lead frame obtained by pre-plating a material including nickel and palladium onto the aforementioned lead frame and then plating at least one of silver (Ag) and gold (Au) thereon, a PCB, and the like, to encapsulate a semiconductor device, thereby fabricating a semiconductor apparatus.

The semiconductor device encapsulated by the epoxy resin composition according to embodiments of the present invention exhibits excellent heat dissipation and flexural strength. Specifically, the epoxy resin composition for encapsulating a semiconductor device has a thermal conductivity of about 3 W/mK to about 10 W/mK, specifically about 3.8 W/mK to about 8 W/mK, more specifically about 3.9 W/mK to about 7.5 W/mK, as measured on a thermal conductivity specimen (ASTM D5470) at 25° C., which is prepared by injection molding of the epoxy resin composition under conditions of a mold temperature of 175° C., an injection load of 9 MPa, and a curing time of 120 seconds using a transfer molding machine. Within this range, the semiconductor device exhibits excellent heat dissipation properties.

Hereinafter, the present invention will be described in more detail with reference to some examples. It should be understood that these examples are provided for illustration only and are not to be construed in any way as limiting the present invention.

In addition, descriptions of details apparent to those skilled in the art will be omitted for clarity.

EXAMPLES (A) Epoxy Resin
(a1) Biphenyl type epoxy resin: YX-4000H produced by Japan Epoxy Resin was used.
(a2) Phenol aralkyl type epoxy resin: NC-3000 produced by Nippon Kayaku was used.
(B) Curing Agent
(b1) Polyfunctional phenol resin: MEH-7500-3S produced by Meiwa Chem was used.
(b2) Phenol aralkyl type phenol resin: MEH-7851-SS produced by Meiwa Chem was used.
(b3) Phenol novolac type phenol resin: H-4 produced by Meiwa Chem was used.

(C) Curing accelerator: 2-phenyl-4-methyl imidazole (2P4MHZ) produced by Shikoku Chemical was used.
(D) Coupling agent: Epoxysilane (A-187) produced by CHISSO Corporation was used.
(E) Inorganic Fillers
(e1) As the inorganic fillers, a mixture including 70 wt % of alumina (DAB-10SI, DENKA Co., Ltd.) having an average particle diameter of 15 μm, 20 wt % of alumina (DAB-10FC, DENKA Co., Ltd.) having an average particle diameter of 7 μm, 9 wt % of alumina (ASFP-20, DENKA Co., Ltd.) having an average particle diameter of 1 μm, and 1 wt % of Nanotubes 1 (PNT-01, BengBu Xinyuan Materials Tech, Formula: $Al_2O_3 \cdot (SiO_2)_2 \cdot 2.5(H_2O)$, inner diameter: 40 nm, outer diameter: 100 nm, length: 3 μm, specific surface area: 35.2 m$^2$/g, thermal conductivity: 15 W/mK, mole ratio of Si to Al: 1:1, pH: 7.93) was used.
(e2) The same mixture as (e1) was used except that the mixture included 5 wt % of alumina having an average particle diameter of 1 μm and 5 wt % of Nanotubes 1.
(e3) The same mixture as (e1) was used except that the mixture did not include the alumina having an average particle diameter of 1 μm and included 10 wt % of Nanotubes 1.
(e4) The same mixture as (e3) was used except that the mixture included 65 wt % of alumina having an average particle diameter of 15 μm and 15 wt % of Nanotubes 1.
(e5) The same mixture as (e1) was used except that the mixture included Nanotubes 2 (PNT-X2, BengBu Xinyuan Materials Tech, Formula: $Al_2O_3 \cdot SiO_2 \cdot 0.5(H_2O)$, inner diameter: 120 nm, outer diameter: 250 nm, length: 6 μm, specific surface area: 12.3 m$^2$/g, thermal conductivity: 19 W/mK, mole ratio of Si to Al: 1:2, pH: 8.56), instead of Nanotubes 1.
(e6) The same mixture as (e1) was used except that the mixture included Nanotubes 3 (PNT-X3, BengBu Xinyuan Materials Tech, Formula: $Al_2O_3 \cdot (SiO_2)_4 \cdot 4.5(H_2O)$, inner diameter: 90 nm, outer diameter: 130 nm, length: 4.5 μm, specific surface area: 17.6 m$^2$/g, thermal conductivity: 11 W/mK, mole ratio of Si to Al: 2:1, pH: 6.93), instead of Nanotubes 1.
(e7) The same mixture as (e1) was used except that the mixture did not include the aforementioned nanotubes and included 10 wt % of alumina having an average particle diameter of 1 μm.
(e8) The same mixture as (e7) was used except that the mixture included 65 wt % of alumina having an average particle diameter of 15 μm and 25 wt % of alumina having an average particle diameter of 7 μm.
(e9) The same mixture as (e7) was used except that the mixture included 15 wt % of alumina having an average particle diameter of 7 μm and 15 wt % of alumina having an average particle diameter of 1 μm.

TABLE 1

|   |   | Alumina 1 | Alumina 2 | Alumina 3 | Nanotube 1 | Nanotube 2 | Nanotube 3 |
|---|---|---|---|---|---|---|---|
| (E) | (e1) | 70 | 20 | 9 | 1 | — | — |
|   | (e2) | 70 | 20 | 5 | 5 | — | — |
|   | (e3) | 70 | 20 | — | 10 | — | — |
|   | (e4) | 65 | 20 | — | 15 | — | — |
|   | (e5) | 70 | 20 | 9 | — | 1 | — |
|   | (e6) | 70 | 20 | 9 | — | — | 1 |
|   | (e7) | 70 | 20 | 10 | — | — | — |

TABLE 1-continued

|  | Alumina 1 | Alumina 2 | Alumina 3 | Nanotube 1 | Nanotube 2 | Nanotube 3 |
|---|---|---|---|---|---|---|
| (e8) | 65 | 25 | 10 | — | — | — |
| (e9) | 70 | 15 | 15 | — | — | — |

Alumina 1: Alumina having an average particle diameter of 15 μm (DAB-10SI, DENKA Co., Ltd.)
Alumina 2: Alumina having an average particle diameter of 7 μm (DAB-10FC, DENKA Co., Ltd.)
Alumina 3: Alumina having an average particle diameter of 1 μm (ASFP-20, DENKA Co., Ltd.)
Nanotubes 1: PNT-01 produced by BengBu Xinyuan Materials Tech (Formula: $Al_2O_3 \cdot (SiO_2)_2 \cdot 2.5(H_2O)$, inner diameter: 40 nm, outer diameter: 100 nm, length: 3 μm, specific surface area: 35.2 m$^2$/g, thermal conductivity: 15 W/mK, mole ratio of Si to Al: 1:1, pH: 7.93)
Nanotubes 2: PNT-X2 produced by BengBu Xinyuan Materials Tech (Formula: $Al_2O_3 \cdot SiO_2 \cdot 0.5(H_2O)$, inner diameter: 120 nm, outer diameter: 250 nm, length: 6 μm, specific surface area: 12.3 m$^2$/g, thermal conductivity: 19 W/mK, mole ratio of Si to Al: 1:2, pH: 8.56)
Nanotubes 3: PNT-X3 produced by BengBu Xinyuan Materials Tech (Formula: $Al_2O_3 \cdot (SiO_2)_4 \cdot 4.5(H_2O)$, inner diameter: 90 nm, outer diameter: 130 nm, length: 4.5 μm, specific surface area: 17.6 m$^2$/g, thermal conductivity: 11 W/mK, mole ratio of Si to Al: 2:1, pH: 6.93)

(F) Colorant
Carbon black: MA-600B produced by Mitsubishi Chemical was used.

(G) Release agent: Carnauba wax was used.

Examples 1 to 6 and Comparative Examples 1 to 3

The above components were weighed in amounts as listed in Table 2 and uniformly mixed at 25° C. to 30° C. for 30 minutes using a Henschel mixer (KSM-22, KEUM SUNG MACHINERY Co., Ltd.), followed by melt kneading at a temperature of up to 110° C. for 30 minutes using a continuous kneader and then cooling to a temperature of 10° C. to 15° C. and pulverizing, thereby preparing epoxy resin compositions for encapsulating a semiconductor device.

TABLE 2

| (Unit: wt %) | | Example 1 | Example 2 | Example 3 | Example 4 | Example 5 | Example 6 | Comp. Example 1 | Comp. Example 2 | Comp. Example 3 |
|---|---|---|---|---|---|---|---|---|---|---|
| A | a1 | 1.79 | 1.79 | 1.79 | 1.79 | 1.79 | 1.79 | 1.79 | 1.79 | 1.79 |
|  | a2 | 1.80 | 1.80 | 1.80 | 1.80 | 1.80 | 1.80 | 1.80 | 1.80 | 1.80 |
| B | b1 | 0.48 | 0.48 | 0.48 | 0.48 | 0.48 | 0.48 | 0.48 | 0.48 | 0.48 |
|  | b2 | 0.77 | 0.77 | 0.77 | 0.77 | 0.77 | 0.77 | 0.77 | 0.77 | 0.77 |
|  | b3 | 0.69 | 0.69 | 0.69 | 0.69 | 0.69 | 0.69 | 0.69 | 0.69 | 0.69 |
| C |  | 0.07 | 0.07 | 0.07 | 0.07 | 0.07 | 0.07 | 0.07 | 0.07 | 0.07 |
| D |  | 0.40 | 0.40 | 0.40 | 0.40 | 0.40 | 0.40 | 0.40 | 0.40 | 0.40 |
| E | e1 | 93.0 | — | — | — | — | — | — | — | — |
|  | e2 | — | 93.0 | — | — | — | — | — | — | — |
|  | e3 | — | — | 93.0 | — | — | — | — | — | — |
|  | e4 | — | — | — | 93.0 | — | — | — | — | — |
|  | e5 | — | — | — | — | 93.0 | — | — | — | — |
|  | e6 | — | — | — | — | — | 93.0 | — | — | — |
|  | e7 | — | — | — | — | — | — | 93.0 | — | — |
|  | e8 | — | — | — | — | — | — | — | 93.0 | — |
|  | e9 | — | — | — | — | — | — | — | — | 93.0 |
| F |  | 0.30 | 0.30 | 0.30 | 0.30 | 0.30 | 0.30 | 0.30 | 0.30 | 0.30 |
| G |  | 0.70 | 0.70 | 0.70 | 0.70 | 0.70 | 0.70 | 0.70 | 0.70 | 0.70 |
| Total |  | 100 | 100 | 100 | 100 | 100 | 100 | 100 | 100 | 100 |

Each of the epoxy resin compositions for encapsulating a semiconductor device prepared in Examples and Comparative Examples was evaluated as to physical properties by the following methods. Results are shown in Table 3.

Property Evaluation Method

The following properties were evaluated. Results are shown in Table 3.

(1) Spiral flow (inch)): the epoxy resin composition was injected into a mold for measuring spiral flow in accordance with EMMI-1-66 under conditions of a mold temperature of 175° C., an injection pressure of 70 kgf/cm$^2$, an injection load of 9 MPa, and a curing time of 90 seconds using a low-pressure transfer molding machine, followed by measurement of flow length. Higher values indicate better flowability.

(2) Thermal conductivity: Thermal conductivity was measured on a specimen for evaluation at 25° C. in accordance with ASTM D5470.

(3) Coefficient of thermal expansion: Coefficient of thermal expansion was measured in accordance with ASTM D696.

(4) Flexural strength and flexural modulus: Standard specimens were prepared in accordance with ASTM D790, cured at 175° C. for 4 hours in an oven (JEIO TECH), and then flexural strength and flexural modulus were measured at 260° C. on the cured specimens using a UTM.

(5) Moisture absorption rate: Standard specimens were prepared in accordance with ASTM D792, cured at 175° C. for 4 hours in an oven (JEIO TECH), and then moisture adsorption rate was measured at 25° C. on the cured specimens using a pressure cooker tester (PCT).

(6) Thermal shock testing (evaluation of cracking and delamination): A multi-chip package (a 0.55 mm thick package composed of 4 NAND Flash Chips and prepared by molding at 175° C. for 120 seconds using a press and molds (Secron Co., Ltd.)) subjected to preconditioning (wherein the package was subjected to moisture removal process in a chamber at 30° C. and 60% RH for 192 hours and treatment by IR reflow (Japan Pulse Laboratories Inc.) three times) was left at −65° C. for 10 minutes, 25° C. for 10 minutes, and 150° C. for 10 minutes. After performing this procedure for 1,000 cycles, the package was evaluated as to internal and external cracking and delamination using a non-destructive inspection apparatus, SAT. In total, 240 packages were tested.

(7) Evaluation of heat dissipation: An assembled quad flat package (QFP) was left in an oven (JEIO TECH) at 195° C. for 1,008 hours, and then evaluated as to whether the package operated normally (or malfunctioned) through operation test. In total, 256 packages were tested.

TABLE 3

|  |  | Example | | | | | | Comparative Example | | |
| --- | --- | --- | --- | --- | --- | --- | --- | --- | --- | --- |
|  |  | 1 | 2 | 3 | 4 | 5 | 6 | 1 | 2 | 3 |
| Spiral flow (inch) | | 61 | 55 | 42 | 33 | 64 | 56 | 64 | 59 | 47 |
| Thermal conductivity (W/mK) | | 4.0 | 4.3 | 4.5 | 4.7 | 3.8 | 4.1 | 3.5 | 3.5 | 3.8 |
| Glass transition temperature (Tg) | | 132 | 131 | 133 | 134 | 132 | 131 | 135 | 136 | 133 |
| Coefficient of thermal expansion α1 (μm/m, ° C.) | | 8.5 | 8.3 | 8.2 | 8.5 | 8.4 | 8.3 | 8.4 | 8.5 | 8.7 |
| Flexural strength (kgf/mm2, 260° C.) | | 2.4 | 2.5 | 3.2 | 3.9 | 2.3 | 2.4 | 1.5 | 1.6 | 1.4 |
| Flexural modulus (kfg/mm2, 260° C.) | | 64 | 62 | 73 | 79 | 62 | 66 | 65 | 65 | 63 |
| Moisture absorption rate (wt %) | | 0.273 | 0.267 | 0.295 | 0.293 | 0.270 | 0.272 | 0.284 | 0.306 | 0.301 |
| Thermal shock test | Number of packages suffering cracking | 0/240 | 0/240 | 0/240 | 0/240 | 0/240 | 0/240 | 7/240 | 4/240 | 6/240 |
|  | Number of packages suffering delamination | 0/240 | 0/240 | 0/240 | 0/240 | 0/240 | 0/240 | 13/240 | 15/240 | 14/240 |
| Evaluation of heat dissipation | Number of packages suffering malfunction | 0/256 | 0/256 | 0/256 | 0/256 | 0/256 | 0/256 | 3/256 | 1/256 | 2/256 |

As shown in table 3, the resin composition prepared in Examples and including the nanomaterials containing silicon (Si) and aluminum (Al) had excellent heat dissipation properties and flexural strength, were highly resistant to thermal shocks, and exhibited excellent thermal conductivity without suffering deterioration in flowability, coefficient of thermal expansion, and moisture absorption rate. On the contrary, it could be seen that the resin composition prepared in Comparative Examples and not including the nanomaterials containing silicon (Si) and aluminum (Al) exhibited reduced flexural strength, were vulnerable to thermal shock, and had poor heat dissipation properties.

It should be understood that the present invention is not limited to the above embodiments and the accompanying drawings, and that various modifications, variations, and alterations can be made by those skilled in the art without departing from the spirit and scope of the present invention. Therefore, it should be understood that these embodiments and the accompanying drawings are given by way of illustration only and are not to be construed in any way as limiting the present invention.

The invention claimed is:

1. An epoxy resin composition for encapsulating a semiconductor device, the composition comprising:
    an epoxy resin,
    a curing agent, and
    inorganic fillers, wherein the inorganic fillers include:
        particulate alumina, and
        nanomaterials, the nanomaterials including one or more of nanowires, nanorods, nanotubes, or nanoribbons, which contain silicon (Si) and aluminum (Al), wherein the nanomaterials are represented by Formula 8:

$$Al_2O_3 \cdot (SiO_2)_x \cdot y(H_2O) \quad \text{[Formula 8]}$$

wherein, in Formula 8, x ranges from 0.5 to 5, and y ranges from 1 to 10, wherein the particulate alumina is present in an amount of about 40 wt % to 99.99 wt % based on a total weight of the inorganic fillers, and the nanomaterials are present in an amount of about 0.01 wt % to about 45 wt % based on the total weight of the inorganic fillers, wherein the nanomaterials have an average particle diameter of 10 nm to 500 nm and a specific surface area of 5 m²/g to 100 m²/g, wherein the nanomaterials comprise nanotubes having an inner diameter of 1 nm to 300 nm, an outer diameter of 20 nm to 310 nm, and a length of 0.1 μm to 20 μm, and wherein the epoxy resin is present in an amount of about 0.1 wt % to about 15 wt % and the curing agent is present in an amount of 0.1 wt % to 13 wt % in the epoxy resin composition for encapsulating a semiconductor device.

2. The epoxy resin composition according to claim 1, wherein the nanomaterials have a thermal conductivity of 5 W/mK to 30 W/mK.

3. The epoxy resin composition according to claim 1, wherein the nanomaterials have a pH of 7 to 9.

4. The epoxy resin composition according to claim 1, wherein the nanomaterials have a structure in which one or more silica (SiO₂) layers and one or more alumina (Al₂O₃) layers are stacked one above another.

5. The epoxy resin composition according to claim 1, wherein the nanomaterials are present in an amount of 0.01 wt % to 40 wt % in the composition in terms of solid content.

6. The epoxy resin composition according to claim 1, wherein the particulate alumina includes:
   particulate alumina having an average particle diameter of greater than 10 μm and less than or equal to 30 μm.

7. The epoxy resin composition according to claim 1, further comprising: at least one of a curing accelerator, a coupling agent and a colorant.

8. The epoxy resin composition according to claim 1, wherein the epoxy resin composition has a thermal conductivity of 3 W/mK to 10 W/mK, as measured on a thermal conductivity specimen (ASTM D5470) at 25° C., the specimen being prepared by injection molding of the epoxy resin composition under conditions of a mold temperature of 175° C., an injection load of 9 MPa, and a curing time of 120 seconds using a transfer molding machine.

9. A semiconductor device encapsulated using the epoxy resin composition for encapsulating a semiconductor device according to claim 1.

* * * * *